US011022892B2

(12) United States Patent
Warnaar et al.

(10) Patent No.: US 11,022,892 B2
(45) Date of Patent: *Jun. 1, 2021

(54) METHOD OF MEASURING A STRUCTURE, INSPECTION APPARATUS, LITHOGRAPHIC SYSTEM AND DEVICE MANUFACTURING METHOD

(71) Applicant: ASML Netherlands B.V., Veldhoven (NL)

(72) Inventors: Patrick Warnaar, Tilburg (NL); Simon Philip Spencer Hastings, Eindhoven (NL); Alberto Da Costa Assafrao, Veldhoven (NL); Lukasz Jerzy Macht, Eindhoven (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

This patent is subject to a terminal disclaimer.

(21) Appl. No.: 16/669,317

(22) Filed: Oct. 30, 2019

(65) Prior Publication Data
US 2020/0064744 A1 Feb. 27, 2020

Related U.S. Application Data

(63) Continuation of application No. 15/438,364, filed on Feb. 21, 2017, now Pat. No. 10,466,594.

(30) Foreign Application Priority Data

Feb. 26, 2016 (EP) .................................. 16157503

(51) Int. Cl.
*G03B 27/54* (2006.01)
*G03F 7/20* (2006.01)

(52) U.S. Cl.
CPC ...... *G03F 7/70133* (2013.01); *G03F 7/70616* (2013.01)

(58) Field of Classification Search
CPC ............ G03F 7/70133; G03F 7/70616; G03F 7/70625; G03F 7/70683
See application file for complete search history.

(56) References Cited

U.S. PATENT DOCUMENTS

| 7,966,583 B2 | 6/2011 | Van Adrichem et al. |
| 10,466,594 B2 | 11/2019 | Warnaar et al. |
| (Continued) | | |

FOREIGN PATENT DOCUMENTS

| CN | 101720448 A | 6/2010 |
| JP | 2003224057 A | 8/2003 |
| (Continued) | | |

OTHER PUBLICATIONS

Herraez et al., "Fast two-dimensional phase-unwrapping algorithm based on sorting by reliability following a noncontinuous path," Optical Society of America, Applied Optics, vol. 41., No. 35, Dec. 10, 2002; pp. 7437-7444.

(Continued)

*Primary Examiner* — Peter B Kim
(74) *Attorney, Agent, or Firm* — Sterne, Kessler, Goldstein & Fox P.L.L.C.

(57) ABSTRACT

An inspection apparatus (140) measures asymmetry or other property of target structures (T) formed by a lithographic process on a substrate. For a given set of illumination conditions, accuracy of said measurement is influenced strongly by process variations across the substrate and/or between substrates. The apparatus is arranged to collect radiation scattered by a plurality of structures under two or more variants of said illumination conditions (p1−, p1, p1+; λ1−, λ1, λ1+). A processing system (PU) is arranged to derive the measurement of said property using radiation collected under a different selection or combination of said variants for different ones of said structures. The variants may be for example in wavelength, or in angular distribu- (Continued)

tion, or in any characteristic of the illumination conditions. Selection and/or combination of variants is made with reference to a signal quality (302, Q, A) observed in the different variants.

22 Claims, 6 Drawing Sheets

(56) References Cited

U.S. PATENT DOCUMENTS

| | | |
|---|---|---|
| 2002/0135781 A1 | 9/2002 | Singh et al. |
| 2003/0143761 A1 | 7/2003 | Fukuda et al. |
| 2004/0169861 A1 | 9/2004 | Mieher et al. |
| 2006/0033921 A1 | 2/2006 | Den Boef et al. |
| 2006/0066855 A1 | 3/2006 | Boef et al. |
| 2007/0058164 A1 | 3/2007 | Shibata et al. |
| 2010/0201963 A1 | 8/2010 | Cramer et al. |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0069292 A1 | 3/2011 | Den Boef |
| 2011/0102753 A1 | 5/2011 | Van De Kerkhof et al. |
| 2012/0044470 A1 | 2/2012 | Smilde et al. |
| 2012/0123581 A1 | 5/2012 | Smilde et al. |
| 2012/0206703 A1 | 8/2012 | Bhattacharyya et al. |
| 2012/0224183 A1 | 9/2012 | Fay et al. |
| 2012/0242970 A1 | 9/2012 | Smilde et al. |
| 2013/0035888 A1 | 2/2013 | Kandel et al. |
| 2013/0141730 A1 | 6/2013 | Quintanilha |
| 2013/0258310 A1 | 10/2013 | Smilde et al. |
| 2013/0271740 A1 | 10/2013 | Quintanilha |
| 2015/0138523 A1 | 5/2015 | Jak et al. |
| 2016/0161864 A1 | 6/2016 | Middlebrooks et al. |

FOREIGN PATENT DOCUMENTS

| | | |
|---|---|---|
| JP | 2005509132 A | 4/2005 |
| JP | 2012169617 A | 9/2012 |
| JP | 2015520859 A | 7/2015 |
| JP | 2016528549 A | 9/2016 |
| KR | 20120092517 A | 8/2012 |
| KR | 20150023502 A | 3/2015 |
| TW | 201506554 A | 2/2015 |
| WO | WO 2013/178422 A1 | 12/2013 |
| WO | WO 2014/074893 A1 | 5/2014 |
| WO | WO 2015/018625 A1 | 2/2015 |
| WO | WO 2016/086056 A1 | 6/2016 |

OTHER PUBLICATIONS

International Search Report and Written Opinion of the International Searching Authority directed to related International Patent Application No. PCT/EP2017/052680, dated Apr. 6, 2017; 11 pages.
Non-Final Office Action directed to U.S. Appl. No. 15/438,364, dated Jun. 14, 2018; 10 pages.
Final Office Action directed to U.S. Appl. No. 15/438,364, dated Nov. 27, 2018; 10 pages.
Non-Final Office Action directed to U.S. Appl. No. 15/438,364, dated Mar. 7, 2019; 10 pages.
Notice of Allowance directed to U.S. Appl. No. 15/438,364, dated Jun. 19, 2019; 5 pages.
Notice of Allowance directed to U.S. Appl. No. 15/438,364, dated Sep. 18, 2019; 3 pages.
Search Report with English-language translation attached directed to related Japanese Patent Application No. 2018-540802, dated Jul. 19, 2019; 34 pages.
International Preliminary Report on Patentability directed to related International Patent Application No. PCT/EP2017/052680, dated Aug. 28, 2018; 6 pages.

METHOD OF MEASURING A STRUCTURE, INSPECTION APPARATUS, LITHOGRAPHIC SYSTEM AND DEVICE MANUFACTURING METHOD

CROSS-REFERENCE TO RELATED APPLICATIONS

This application is a continuation of U.S. patent application Ser. No. 15/438,364, filed Feb. 21, 2017, which claims priority of European Application No. 16157503.0, which was filed on Feb. 26, 2016, and are incorporated herein in their entirety by reference.

BACKGROUND

Field of the Invention

The present invention relates to methods and apparatus for metrology usable, for example, in the manufacture of devices by lithographic techniques, and to methods of manufacturing devices using lithographic techniques.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, it is desirable frequently to make measurements of the structures created, e.g. for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g. intensity at a single angle of reflection as a function of wavelength; intensity at one or more wavelengths as a function of reflected angle; or polarization as a function of reflected angle—to obtain a diffraction "spectrum" from which a property of interest of the target can be determined.

Examples of known scatterometers include angle-resolved scatterometers of the type described in US2006033921A1 and US2010201963A1, The targets used by such scatterometers are relatively large gratings, e.g. 40 µm by 40 µm, and the measurement beam generates a spot that is smaller than the grating (i.e., the grating is underfilled). In addition to measurement of feature shapes by reconstruction, diffraction based overlay can be measured using such apparatus, as described in published patent application US2006066855A1. Diffraction-based overlay metrology using dark-field imaging of the diffraction orders enables measurement of overlay and other parameters on smaller targets. These targets can be smaller than the illumination spot and may be surrounded by product structures on a substrate. The intensities from the environment product structures can efficiently be separated from the intensities from the overlay target with the dark-field detection in the image-plane.

Examples of dark field imaging metrology can be found in patent applications US20100328655A1 and US2011069292A1 which documents are hereby incorporated by reference in their entirety. Further developments of the technique have been described in published patent publications US20110027704A, US20110043791A, US2011102753A1, US20120044470A, US20120123581A, US20120242970A1, US20130258310A, US20130271740A and WO2013178422A1. Typically in these methods it is desired to measure asymmetry as a property of the target. Targets can be designed so that measurement of asymmetry can be used to obtain measurement of various performance parameters such as overlay, focus or dose. Asymmetry of the target is measured by detecting differences in intensity between opposite portions of the diffraction spectrum using the scatterometer. For example, the intensities of +1 and −1 diffraction orders may be compared, to obtain a measure of asymmetry.

In these known techniques, appropriate illumination modes and image detection modes are used to obtain the +1 and −1 diffraction orders from periodic structures (gratings) within the target. Comparing the intensity of these opposite diffraction orders provides a measurement of asymmetry of the structure. In many cases, the asymmetry signals obtained are dependent to an unknown extent on process variables, not only the performance parameter of interest. In order to improve measurement accuracy of the parameter of interest, very specific illumination conditions can be defined, for example in terms of the spectrum and angular distribution of illuminating radiation. For highly three-dimensional structures, very narrow spectral peaks and very specific illumination profiles may be required, to obtain an asymmetry signal of good quality.

Unfortunately, it is found that process variations across a substrate and between substrates may mean that the illumination conditions that are optimal for one part of the substrate are sub-optimal, and even useless, at some other part. It would be hard to know in advance how to vary the illumination conditions for every part of every wafer, without making additional measurements.

SUMMARY OF THE INVENTION

The present invention aims to improve accuracy of measurements in the presence of process variations across a substrate and/or between substrates.

The invention in a first aspect provides a method of measuring a property of a plurality of structures formed by a lithographic process on one or more substrates, wherein a measurement of said property of each structure is derived at least partly from radiation collected after being scattered by the structure under a given set of illumination conditions, wherein, for a given set of illumination conditions, accuracy of said measurement for different ones of said structures is influenced by process variations across the substrate and/or between substrates, and wherein the method is performed using radiation collected under two or more variants of said illumination conditions, and for different ones of said structures the measurement of said property is derived using radiation collected under a different selection or combination of said variants.

The variants of illumination conditions may vary in terms of wavelength, for example, angular distribution of illumination, focus, polarization or any other characteristic of the illumination conditions.

In some embodiments, for at least a subset of the structures, radiation is collected from each structure using a common set of variants of said illumination conditions, and the selection or combination of variants used in deriving the measurement is performed after collecting the radiation.

The selection or combination of variants for said subset of the structures may be based for example on a signal quality observed in the radiation collected from the structure under different variants of said illumination conditions. In the case of asymmetry measurements, for example, an amplitude of the asymmetry signal is readily determined from a group of structures.

The method may further comprise calculating a performance parameter of said lithographic process based on the asymmetry determined by the method for a plurality of periodic structures. The performance parameter may be, for example, overlay, focus or dose.

The invention further provides an inspection apparatus for measuring a property of a plurality of structures formed by a lithographic process on one or more substrates, the apparatus comprising an illumination optical system, an collection optical system and a processing system, the processing system being arranged to derive a measurement of said property of each structure at least partly from radiation collected by said collection optical system after being scattered by the structure under one or more sets of illumination conditions established by the illumination optical system, wherein, for a given set of illumination conditions, accuracy of said measurement for different ones of said structures is influenced by process variations across the substrate and/or between substrates, wherein the illumination system and collection system are arranged to collect radiation scattered by a plurality of structures under two or more variants of said illumination conditions, and wherein said processing system is arranged to derive the measurement of said property using radiation collected under a different selection or combination of said variants for different ones of said structures.

The invention further provides a computer program product comprising machine readable instructions for causing a programmable processing device to implement a method according to the invention as set forth above. The machine readable instructions may be embodied, for example, in a non-transitory storage medium.

The invention further provides a lithographic system including a lithographic apparatus and an inspection apparatus according to the invention, as set forth above.

The invention further provides a method of manufacturing devices wherein a device pattern is applied to a series of substrates using a lithographic process, the method including measuring one or more properties of at one or more structures formed as part of or beside said device pattern on at least one of said substrates using a method as claimed in any of claims 1 to 17, and controlling the lithographic process for later substrates in accordance with the result of the measuring.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
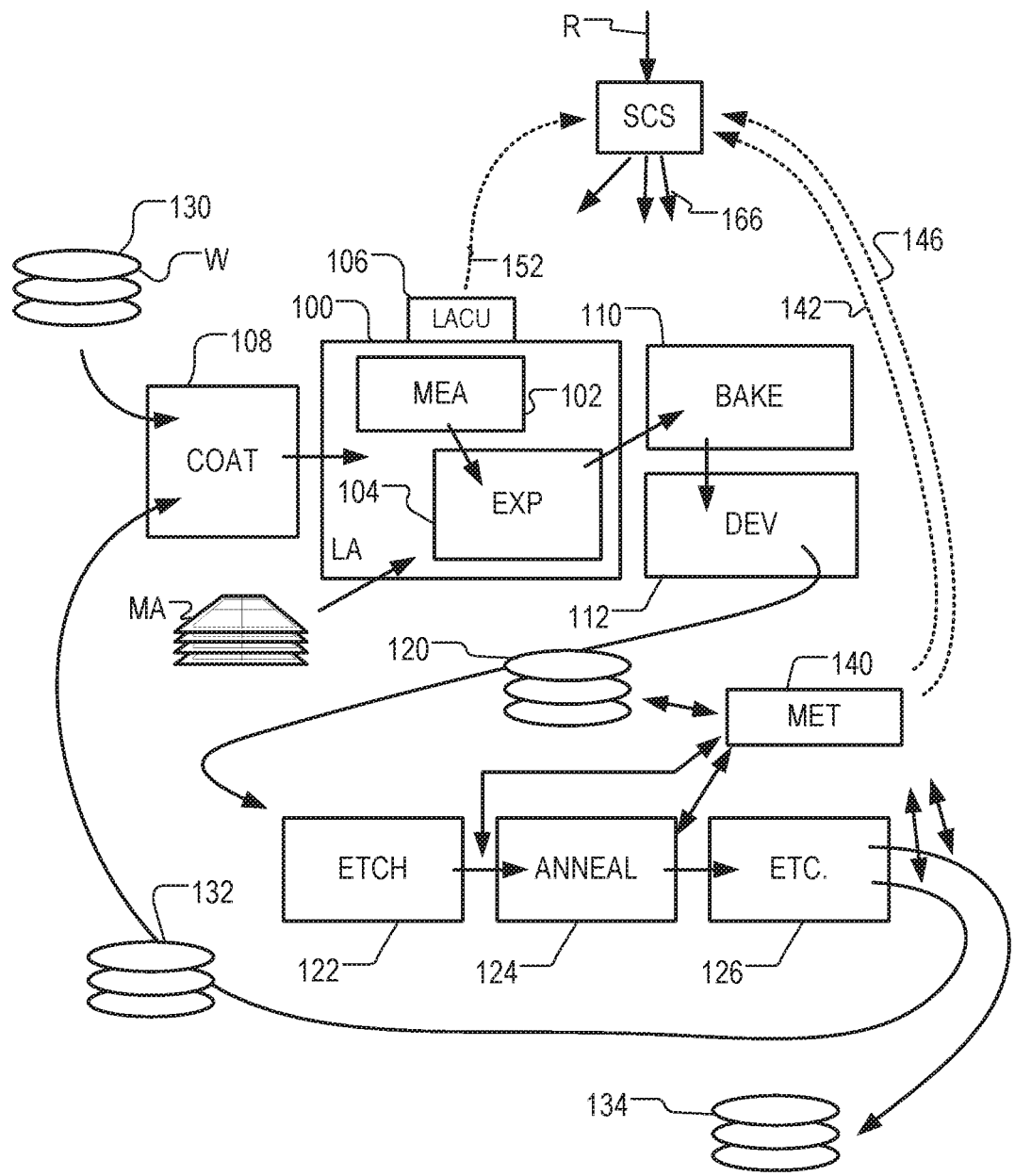
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls the movements and measurements of various actuators and sensors, causing the apparatus LA to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy. The apparatus may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. Lithographic apparatus LA for example is of a so-called dual stage type which has two substrate tables WTa and WTb and two stations—an exposure station and a measurement station—between which the substrate tables can be exchanged.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up, or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 and 146 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Example Inspection Apparatus

FIG. 2(a) shows schematically the key elements of an inspection apparatus implementing so-called dark field imaging metrology. The apparatus may be a stand-alone device or incorporated in either the lithographic apparatus LA, e.g., at the measurement station, or the lithographic cell LC. An optical axis, which has several branches throughout the apparatus, is represented by a dotted line O. A target grating structure T and diffracted rays are illustrated in more detail in FIG. 2(b).

As described in the prior applications cited in the introduction, the dark-field-imaging apparatus of FIG. 2(a) may be part of a multi-purpose angle-resolved scatterometer that may be used instead of, or in addition to, a spectroscopic scatterometer. In this type of inspection apparatus, radiation emitted by a radiation source 11 is conditioned by an illumination system 12. For example, illumination system 12 may include a collimating lens system 12a, a color filter 12b, a polarizer 12c and an aperture device 13. The conditioned radiation follows an illumination path IP, in which it is reflected by partially reflecting surface 15 and focused into a spot S on substrate W via a microscope objective lens 16. A metrology target T may be formed on substrate W. Lens 16, has a high numerical aperture (NA), preferably at least 0.9 and more preferably at least 0.95. Immersion fluid can be used to obtain numerical apertures over 1 if desired.

The objective lens 16 in this example serves also to collect radiation that has been scattered by the target. Schematically, a collection path CP is shown for this returning radiation. The multi-purpose scatterometer may have two or more measurement branches in the collection path. The illustrated example has a pupil imaging branch comprising pupil imaging optical system 18 and pupil image sensor 19. An imaging branch is also shown, which will be described in more detail below. Additionally, further optical systems and branches will be included in a practical apparatus, for example to collect reference radiation for intensity normalization, for coarse imaging of capture targets, for focusing and so forth. Details of these can be found in the prior publications mentioned above.

Where a metrology target T is provided on substrate W, this may be a 1-D grating, which is printed such that after development, the bars are formed of solid resist lines. The target may be a 2-D grating, which is printed such that after development, the grating is formed of solid resist pillars or vias in the resist. The bars, pillars or vias may alternatively be etched into the substrate. Each of these gratings is an example of a target structure whose properties may be investigated using the inspection apparatus. In the case of gratings, the structure is periodic. In the case of an overlay metrology target, the grating is printed on top of or interleaved with another grating that has been formed by a previous patterning step.

The various components of illumination system 12 can be adjustable to implement different metrology 'recipes' within the same apparatus. In addition to selecting wavelength (color) and polarization as characteristics of the illuminating radiation, illumination system 12 can be adjusted to implement different illumination profiles. The plane of aperture device 13 is conjugate with a pupil plane of objective lens 16 and the plane of the pupil image detector 19. Therefore, an illumination profile defined by aperture device 13 defines the angular distribution of light incident on substrate W in spot S. To implement different illumination profiles, an aperture device 13 can be provided in the illumination path. The aperture device may comprise different apertures 13a, 13b, 13c etc. mounted on a movable slide or wheel. It may alternatively comprise a fixed or programmable spatial light modulator (SLM) 13c. As a further alternative, optical fibers may be disposed at different locations in the illumination pupil plane and used selectively to deliver light or not deliver light at their respective locations. These variants are all discussed and exemplified in the documents cited above. The aperture device may be of a reflective form, rather than transmissive. For example, a reflective SLM might be used. Indeed, in an inspection apparatus working in the UV or EUV waveband most or all of the optical elements may be reflective.

Depending on the illumination mode, example rays 30a may be provided so that the angle of incidence is as shown at 'I' in FIG. 2(b). The path of the zero order ray reflected by target T is labeled '0' (not to be confused with optical axis 'O'). Similarly, in the same illumination mode or in a second illumination mode, rays 30b can be provided, in which case the angles of incidence and reflection will be swapped compared with the first mode. In FIG. 2(a), the zero order rays of the first and second example illumination modes are labeled 0a and 0b respectively.

As shown in more detail in FIG. 2(b), target grating T as an example of a target structure is placed with substrate W normal to the optical axis O of objective lens 16. In the case of an off-axis illumination profile, a ray 30a of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the beam of illuminating rays 30a has a finite width (necessary to admit a useful quantity of light), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown.

In the branch of the collection path for dark-field imaging, imaging optical system 20 forms an image T' of the target on the substrate W on sensor 23 (e.g. a CCD or CMOS sensor). An aperture stop 21 is provided in a plane in the imaging branch of the collection path CP which is conjugate to a pupil plane of objective lens 16. Aperture stop 21 may also be called a pupil stop. Aperture stop 21 can take different forms, just as the illumination aperture can take different forms. The aperture stop 21, in combination with the effective aperture of lens 16, determines what portion of the scattered radiation is used to produce the image on sensor 23. Typically, aperture stop 21 functions to block the zeroth order diffracted beam so that the image of the target formed on sensor 23 is formed only from the first order beam(s). In an example where both first order beams are combined to form an image, this would be the so-called dark field image, equivalent to dark-field microscopy.

The images captured by sensor 23 are output to image processor and controller PU, the function of which will depend on the particular type of measurements being performed. For the present purpose, measurements of asymmetry of the target structure are performed. Asymmetry measurements can be combined with knowledge of the target structures to obtain measurements of performance parameters of lithographic process used to form them. Performance parameters that can be measured in this way include for example overlay, focus and dose. Special designs of targets are provided to allow these measurements of different performance parameters to be made through the same basic asymmetry measurement method.

Referring again to FIG. 2(b) and the illuminating rays 30a, +1 order diffracted rays from the target grating will enter the objective lens 16 and contribute to the image recorded at sensor 23. Rays 30b are incident at an angle opposite to rays 30a, and so the −1 order diffracted rays enter the objective and contribute to the image. Aperture stop 21 blocks the zeroth order radiation when using off-axis illumination. As described in the prior publications, illumination modes can be defined with off-axis illumination in X and Y directions.

Figure 2:
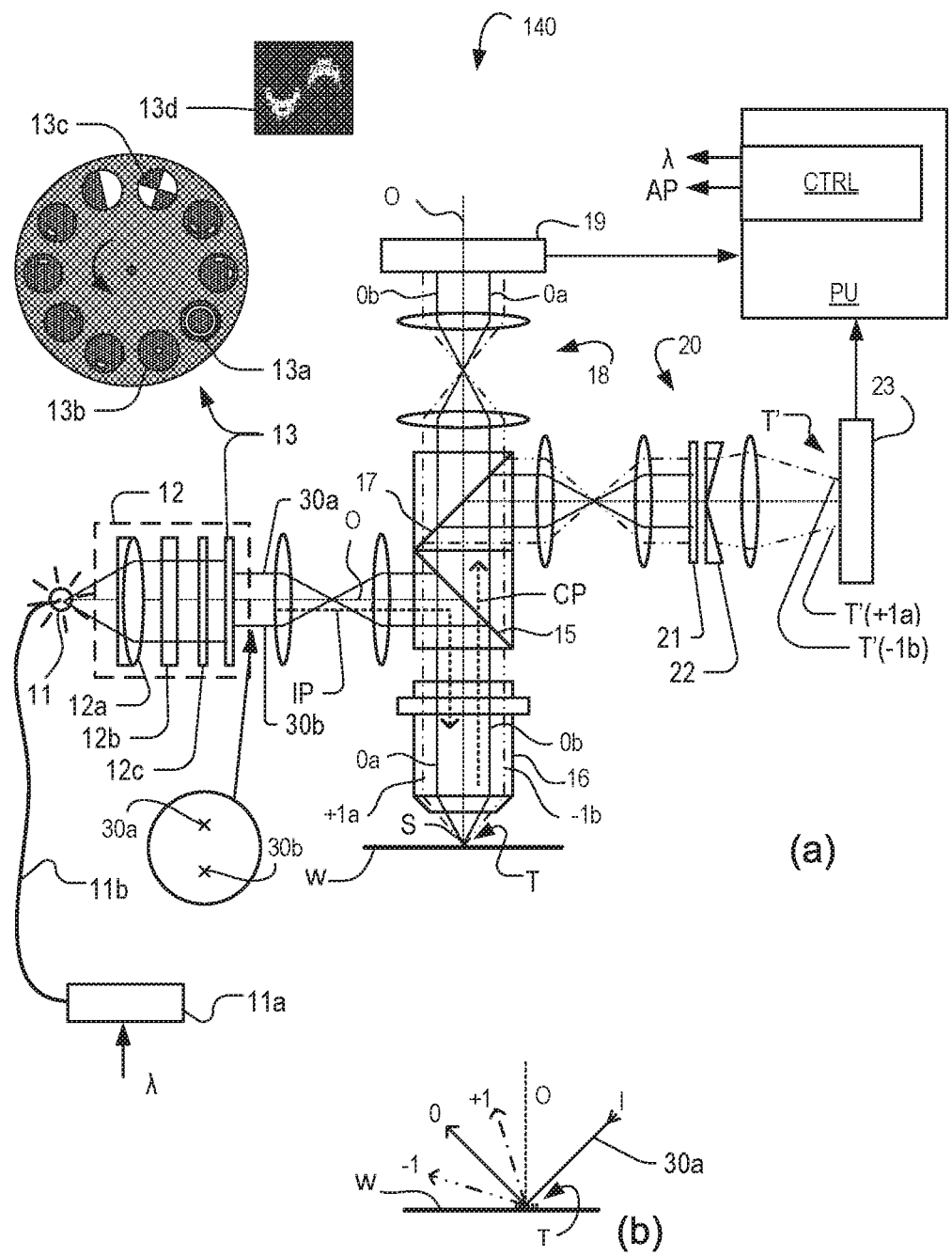
FIG. 2 illustrates schematically (a) an inspection apparatus adapted to perform angle-resolved scatterometry and dark-field imaging inspection methods in accordance with some embodiments of the invention and (b) an enlarged detail of the diffraction of incident radiation by a target grating in the apparatus of FIG. 2.

By comparing images of the target grating under these different illumination modes, asymmetry measurements can be obtained. Alternatively, asymmetry measurements could be obtained by keeping the same illumination mode, but rotating the target. While off-axis illumination is shown, on-axis illumination of the targets may instead be used and a modified, off-axis aperture stop 21 could be used to pass substantially only one first order of diffracted light to the sensor. In a further example, a pair of off-axis prisms 22 are used in combination with an on-axis illumination mode. These prisms have the effect of diverting the +1 and −1 orders to different locations on sensor 23 so that they can be detected and compared without the need for two sequential image capture steps. Effectively, separate images are formed at separated locations on the image sensor 23. In FIG. 2(a) for example, an image T'(+1a), made using +1 order diffraction from illuminating ray 30a, is spatially separated from an image T'(−1b) made using −1 order diffraction from illuminating ray 30b. This technique is disclosed in the above-mentioned published patent application US2011102753A1, the contents of which are hereby incorporated by reference. 2nd, 3rd and higher order beams (not shown in FIG. 2) can be used in measurements, instead of, or in addition to, the first order beams. As a further variation, the off-axis illumination mode can be kept constant, while the target itself is rotated 180 degrees beneath objective lens 16 to capture images using the opposite diffraction orders.

While a conventional lens-based imaging system is illustrated, the techniques disclosed herein can be applied equally with plenoptic cameras, and also with so-called "lensless" or "digital" imaging systems. There is therefore a large degree of design choice, which parts of the processing system for the diffracted radiation are implemented in the optical domain and which are implemented in the electronic and software domains.

Process Sensitivity—Introduction

Figure 3:
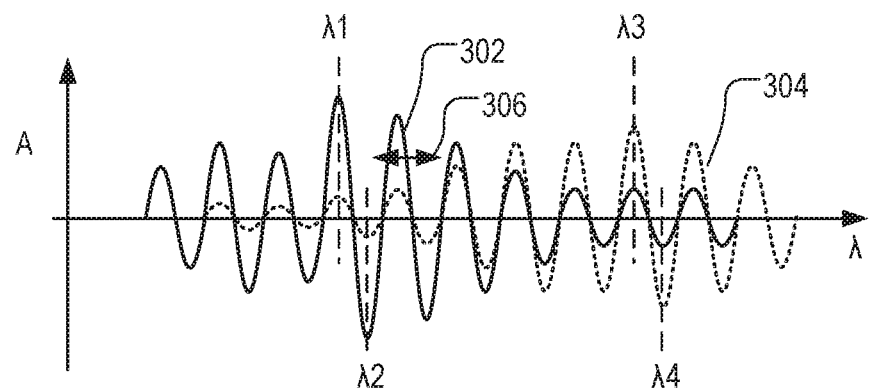
FIG. 3 illustrates the problem of variable process dependency in the relationship between and measurement signal quality and radiation wavelength.

The sensitivity of the detected dark-field image or pupil image to asymmetry in the target structure in some cases is very dependent on parameters of the lithographic process that vary from region to region across the substrate, and/or from substrate to substrate. FIG. 3 illustrates a first example of process sensitivity, namely the dependence of the asymmetry signal quality on wavelength $\lambda$. The vertical axis a represents the strength of the asymmetry signal A obtained from, for example, a grating structure. The target structure in this example is a 3-D structure, such as are used for modern high density memory devices (for example, NAND memory or DRAM).

Because of the large depth of the structure, interference effects mean that the strength of the asymmetry signal varies cyclically as a function of wavelength. The solid curve 302 represents the signal strength as a function of wavelength under illumination of a first polarization, while the dotted curve 304 represents the signal strength under illumination of a second polarization. The units on the vertical and horizontal scales here are arbitrary. However, it will be understood that the cyclic variations seen in these curves have very short period on the wavelength scale, compared with the range of wavelengths and the normal bandwidth of illumination used in a conventional scatterometer. The distance from peak to peak on the wavelength scale may be, for example, less than 50 nm or less than 30 nm wide. A monochrome radiation wavelength $\lambda 1$ would give a very strong asymmetry signal, and a monochrome radiation wavelength $\lambda 2$ gives a very strong asymmetry signal, but of the opposite sign. In another part of the wavelength range, wavelengths $\lambda 3$ and $\lambda 4$ would give the strongest signals, but with the other polarization of illumination. These polarizations can be specified as part of the metrology recipe for a given target or targets. If the inspection apparatus were able to use just one of these wavelengths with a very narrow bandwidth, the signal quality would be good. However, typically the radiation used has a finite bandwidth. If this bandwidth were so wide as to cover even half of a cycle, then the average of the positive peak in the negative peak signals would cancel out, giving no asymmetry signal. Therefore a narrow bandwidth, for example less than 10 nm in width, or even less than 8 nm would be required.

As will be understood, if the cyclic behavior of the signal with respect to wavelength is the result of interference effects through a stack of one or more layers, the exact phase and width of a cycle will depend directly on the thickness of those layers, which may vary across the substrate. Moreover, the curves illustrated in FIG. 3 will move from side to side more than a few nanometers, with variations in performance across the substrate and between substrates. This process variation is indicated by the arrow 306. Accordingly, while wavelengths λ1 and λ2 may provide the strongest asymmetry signals from a metrology target at one location on the wafer under the same wavelengths, they may provide little or no signal at another location where the curve has shifted to the left or right. In other words, for a given wavelength, the quality of the asymmetry signal is highly dependent on process variations.

Figure 4:
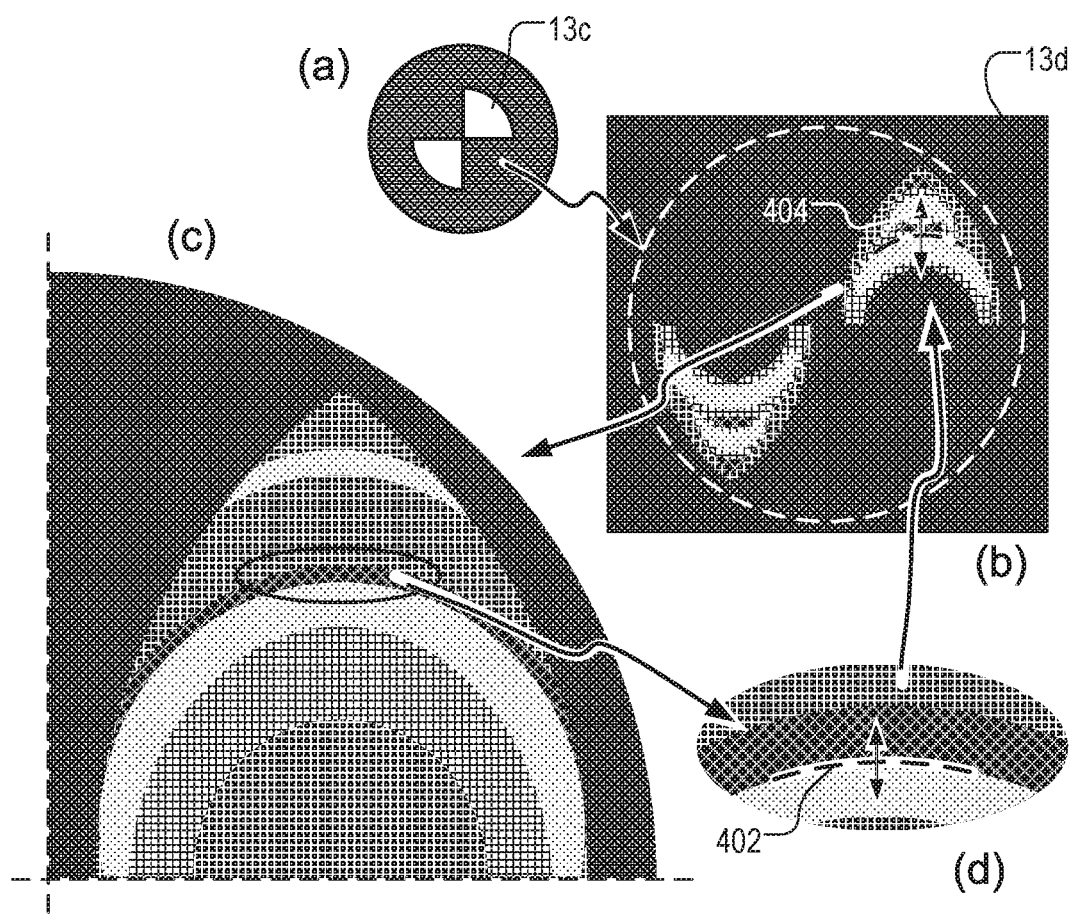
FIG. 4 illustrates the problem of variable process dependency in the relationship between measurement signal quality and angular distribution of radiation (illumination profile)

FIG. 4 illustrates another kind of process dependency, in this case one which influences the best choice of illumination profile for a dark-field imaging metrology. In this example, an aperture of the general form 13c illustrated at (a) is desired. However, to maximize the asymmetry signal and to minimize dependence on process variations other than the parameter of interest, a spatial light modulator (SLM) 13d is being used to make a more selective illumination pattern in each quadrant. A suitable illumination pattern is illustrated at (b). Darker portions represent an absence of light in the illumination pupil, while grey and white portions illustrate the presence of light. It may be remembered that each position in the illumination pupil corresponds to a specific angle of incidence of the illuminating radiation on the target structure. Thus, the pattern of light and dark portions in the illumination pupil defines the angular distribution of illumination at the target structure.

The SLM 13d may be a programmable SLM. A programmable SLM may comprise for example an array of individual pixel-like cells which can be at least turned on or off, and optionally set to intermediate values of transmission or reflectance. In another form of SLM, fixed patterns for example by opaque and/or reflective portions deposited on a substrate can be provided. These are cheaper to implement and, while not having the flexibility of the programmable SLM, they can still be customized for individual product types and layers. In order to calculate the optimum illumination profile, simulation and/or experiment is performed to plot for each pixel how positively it contributes to the wanted asymmetry signal in the detected dark-field image. A plot of sensitivity for each part of the pupil plane is shown at (c), in an enlarged view of one quadrant of the pupil. In the darker portions, a pixel will contribute negatively to the wanted asymmetry signal. In the lighter portions, a pixel will contribute positively. While the illustration at (c) is schematic, it is based on a real example. In the region highlighted by an oval, it will be seen that a region of strongly positively sensitive pixels is immediately adjacent to region of strongly negatively sensitive pixels. This portion is enlarged at (d) in FIG. 4. To obtain the strongest signal quality, pixels in the illumination profile (b) should be very bright in the region of positive sensitivity, and dark in the region of negative sensitivity (or vice versa). Any bright region of the illumination profile that overlaps negatively sensitive pixels will directly cancel out the wanted signal from positively sensitive pixels.

In this way, the illumination profile at (b) is designed. Unfortunately, process variations across the substrate and between substrates cause the boundary 402 between the sensitive and insensitive regions to move. Therefore, if it were possible to take into account these process variations, the boundary(ies) between bright and dark portions in the optimal illumination profile (b) would also move, as indicated by the arrow 404. Even a very slight movement of the boundary 402 could turn a very good illumination profile into a very bad one.

In summary, wavelengths and the angular distribution of illumination are examples of parameters of illumination of the target structure, which can be tuned to a specific structure and process, but for which the success of tuning can be disrupted by process variations across the substrate and between substrates. Other examples of parameters of illumination can also be considered, including, for example, focus height of the spot S.

Optimization of Illumination Parameters

According with principles of the present disclosure, it is proposed that a method of measuring a property of a plurality of structures is performed using radiation collected under two or more variants of illumination conditions, and for different ones of said structures the measurement of said property is derived using radiation collected under a different selection or combination of said variants. This allows more accurate measurements to be obtained when, for a given set of illumination conditions, accuracy of the resulting measurement for different ones of said structures is influenced by process variations across the substrate and/or between substrates. In order to simplify implementation, in the disclosed embodiments, a common plurality of variants will be used at each location and/or substrate, while other embodiments could, so to speak, vary the variants across the substrate and/or between substrates.

Figure 5:
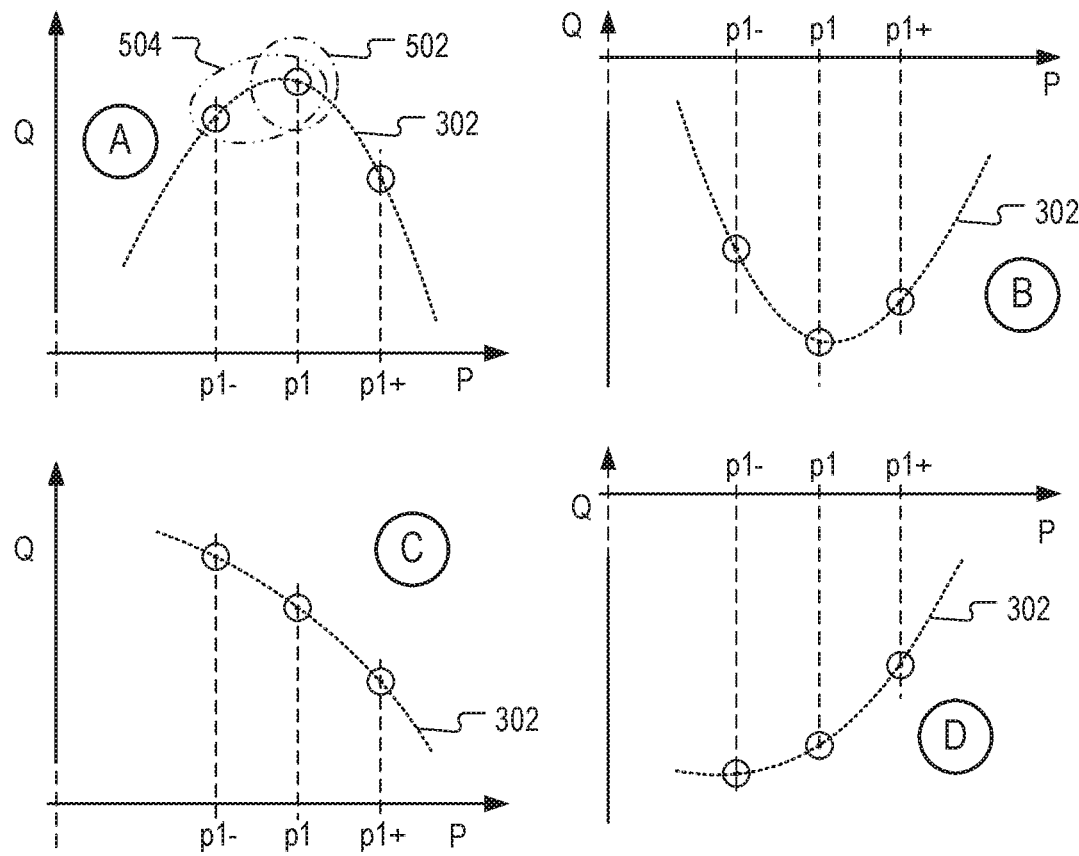
FIG. 5 illustrates four cases that may be obtained when obtaining a measurement signal using three variants of the illumination conditions in an embodiment of the present invention.

FIG. 5 illustrates a first embodiment, in which three variants are used for the measurement of each target structure, at least within a subset of the total number of target structures to be measured. A generic signal quality value Q is plotted against a generic parameter P of the illumination conditions. In the case of asymmetry based metrology, the signal quality value Q can be equated to the asymmetry signal strength A in FIG. 3. In another application, a different signal quality value Q could be defined. With regard to the parameter P, in the example of FIG. 3 the parameter P may be simply the central wavelength of an illumination waveband. In the case of a composite target comprising multiple grating structures, the signal quality Q or "stack sensitivity" can be calculated from measurements on multiple gratings, rather than only a single one of the gratings in isolation. In the dark-field imaging branch of the apparatus of FIG. 2, multiple gratings can be imaged simultaneously, so that the necessary signals are available from one or two image capture. In conclusion, while the method in general refers to a signal quality that applies to each grating structure, the signal quality may be measured collectively for a group of neighboring structures together, and not for each grating in isolation.

FIG. 5 illustrates four cases that may be detected, using three variants of the parameter P, labeled p1, p1− and p1+. Whatever the parameter and the dependency between the parameter and the signal quality may be, a comparison between the signal quality values Q obtained when measuring using the variants p1, p1− and p1+ can only fall into one of four different cases. In case A, the signal quality value for the middle variant p1 is higher than the other two, meaning case A in the drawing. Assuming that the form of the signal quality curve 302 has the form illustrated in FIG. 3, then this implies that the central value p1 falls close to a peak in the signal quality curve. Similarly, in case B, the central value p1 falls on or close to a trough in the signal quality curve. Where the signal quality value Q is an asymmetry signal derived from diffraction signals by the methods described above, then it is known whether the value is positive or negative. Consequently, assuming that the values in case A are positive, then it is known that the optimum signal quality is to be found in the range between p1− and p1+, and that p1 has the best signal quality, of the three variants measured. Similarly, assuming that the values in case B are negative, and knowing that a negative signal gives an accurate measurement just as well as a positive signal in this example, then it is known that the optimum signal quality is to be found in the range between p1− and p1+. Again, p1 has the best signal quality of the three variants measured.

In the cases C and D, either the leftmost variant p1− of the three variants has the highest signal quality, or the rightmost variant p1+ does. If desired, from the cases A and B an assumed curve can be fitted through the measurements, and an optimum value of parameter P can be used if desired. In the cases C and D, only the slope of variation can be determined. As will be illustrated below, using a sufficient number of measurements across the substrate, a model of the variation of the optimum parameter value can be established, so as to resolve ambiguity in the cases C and D.

Returning to FIG. 2, a controller CTRL within the image processor and controller PU provides signals to control the selection of parameters of the illumination conditions, such as wavelength (signal λ) and/or illumination profile (signal AP). In this way, the desired variants can be selected for the measurement of each target structure. Variants may be the same for all target structures across the substrate, and for all target structures of a given recipe across all the substrates of a lot. Alternatively, the selected variants can be varied in a preprogrammed way, or even in an adaptive way, if desired.

Once the signals have been obtained for the set of variants, the image processor and controller PU can apply a number of techniques for the calculation of a measurement of a desired property of the structure, such as asymmetry, and for the calculation from asymmetry values of a measurement of a performance parameter of the lithographic process, such as overlay, focus or dose. In implementing a measurement method on the basis of the above examples, in some embodiments for at least one characteristic of the illumination conditions, a selection or combination of variants comprises selecting a single best variant for use in deriving said measurement. In other embodiments, for at least one characteristic of said illumination conditions the selection or combination of variants can be implemented by calculating a weighted combination of variants, for use in deriving said measurement. In the example of FIG. 5, case A, a selection of a single best variant is indicated by the circle 502, while a selection of two best variants is indicated by the circle 504. The two best variants can be averaged, weighting each according to its signal strength. Alternatively, all three variants, or however many variants are specified, can be weighted each according to its signal quality, in a single combination. There is no need to exclude the poorest sample, if it is weighted sufficiently lowly in the combination.

Figure 6:
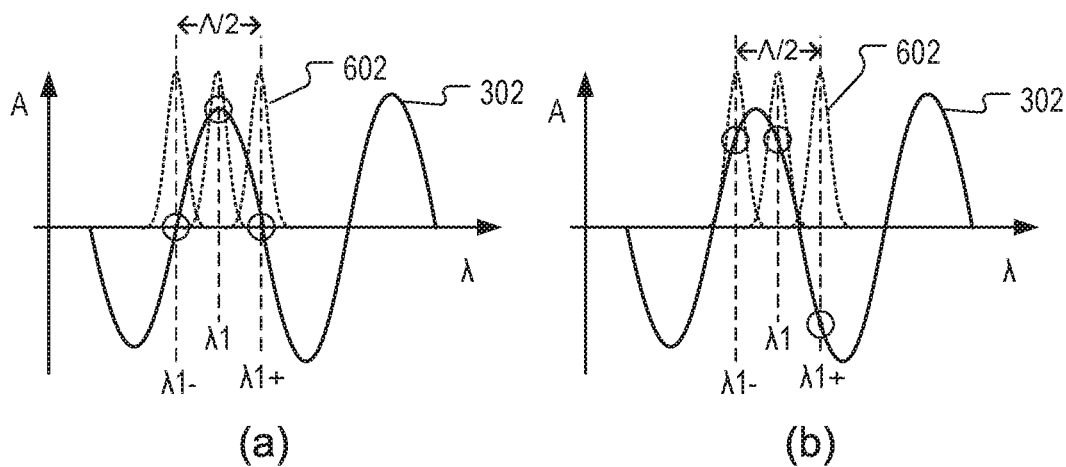
FIG. 6 illustrates an example of selecting three radiation spectra are to be used as variance in an embodiment of the present invention.

Referring to FIG. 6, a particular implementation is illustrated, in which the values of the parameter P are chosen, based on knowledge of the cycle width A of the cyclic variation of the signal quality value Q. In this example, the parameter P is wavelength λ, and the signal quality value Q asymmetry signal strength A, the same as in FIG. 3. Variants chosen are radiation spectra with a nominal wavelength λ1 and two other variants λ1− and λ1+. The radiation spectrum in each variant comprises a narrow peak of radiation centered on these nominal wavelengths. Such peaks 602 are illustrated schematically, overlaid on the graph of asymmetry signal strength. These variants are chosen in this example so that they are equally spaced across a range of wavelengths which corresponds to one half of the cycle width or pitch A of the cyclic variation of the signal quality. The bandwidths of the spectral peaks are made as far as possible to be much smaller than the cycle width, and certainly smaller than a half of the cycle width. In this way, in a best case scenario illustrated in FIG. 6(a), one of the three variants will fall at or near the optimum position on the curve. In a worst-case scenario illustrated in FIG. 6(b), one of the variants will have at least a good signal strength, if not the optimum. In the illustrated example, the widths of the spectral peaks and their spacing are chosen such that they do not have substantial overlap. In practice, provided at least two of the peaks are not substantially overlapping, and fall on different parts of the cyclic variation, one or other of the variants will give a good signal. In the language of the description and claims, references to the spacing or separation of two peaks are intended to refer to the spacing or separation of their respective maxima, independently of their widths and whether they do or do not overlap to a given degree.

In other words, based on some prior experimentation and/or modeling of the target structures and the optical system of the inspection apparatus, a spread of two or more variants can be chosen so that at least one of them will yield a signal strength greater than, say, 50% of the maximum available signal strength. Assuming that the curve 302 has a roughly sinusoidal form, as shown, given a choice of two variants, separated by approximately one quarter of the cycle width A would satisfy this criterion. Again, as mentioned above, choosing three variants allows more information to be derived about the variation of the optimum parameter values, across the substrate. Application of this knowledge can be made to reduce the overall number of measurements required, for example, as will be described below. Extracting this knowledge can also be used for diagnosis of process dependency characteristics.

In the examples of FIG. 3 and FIG. 6, wavelength as a characteristic of the illumination conditions is represented by a variable parameter, said two or more variants being defined by variant values of said parameter. The term "wavelength" is used as shorthand for the spectral characteristics of the illumination, which of course includes a central, peak wavelength, and a spread or bandwidth of wavelengths in the vicinity of the peak wavelength. Depending on the width of the peaks and troughs in the curve 302 of FIG. 3, the bandwidth of the illuminating radiation may need to be chosen to be quite narrow, compared with conventional instruments. The use of a tunable laser 11a and single mode fiber 11b can assist in delivering a suitable character of radiation for each of the variants. While the conventional apparatus is sometimes used to make measurements at widely spaced wavelengths across a spectrum ranging from infrared to visible wavelengths, it will be understood that the "variants" referred to in the present application are generally much more closely spaced. The purpose of the variance is not to provide diversity of measurements, but to ensure that a single measurement can be obtained with sufficient signal quality, and the presence of process variations that introduce differences in response, even around the same nominal wavelength, nominal illumination profile and so forth.

As will be understood, to avoid unnecessary reduction in measurement throughput, the light source and illumination system generally should be arranged so that it is possible to switch between the variants very quickly. In a typical implementation, the time for acquiring an image or diffraction pattern is only part of the move-acquire-measure cycle associated with each new target structure. Nevertheless, any increase in the acquisition time will influence throughput. Techniques described below with reference to FIG. 7 obtain the benefit of the present disclosure, without increasing the acquisition time for every target structure.

The definition of a parameter P can be made in the case of other variables besides wavelength, for example, focal length. As mentioned already, wavelength is not the only parameter of the illumination conditions that could be varied. Another parameter related to the spectrum of the radiation could be, for example, bandwidth. In another embodiment, focal distance of the optical system could be adjusted to make different variants. Polarization is another characteristic of the illumination conditions that could be varied. Polarization angle, for example, could be a parameter that is varied between variants.

In the example of FIG. 4, it may be possible to parameterize the variants of the illumination profile, so that extrapolation and/or interpolation are possible to infer where a best value may lie. A parameter P may be defined as a displacement of the boundary 402, for example, relative to a nominal position. On the other hand, as the illumination profile has so many degrees of freedom, it may be preferred simply to define a number of variants, without trying to analyze any parametric relationship between them.

Figure 7:
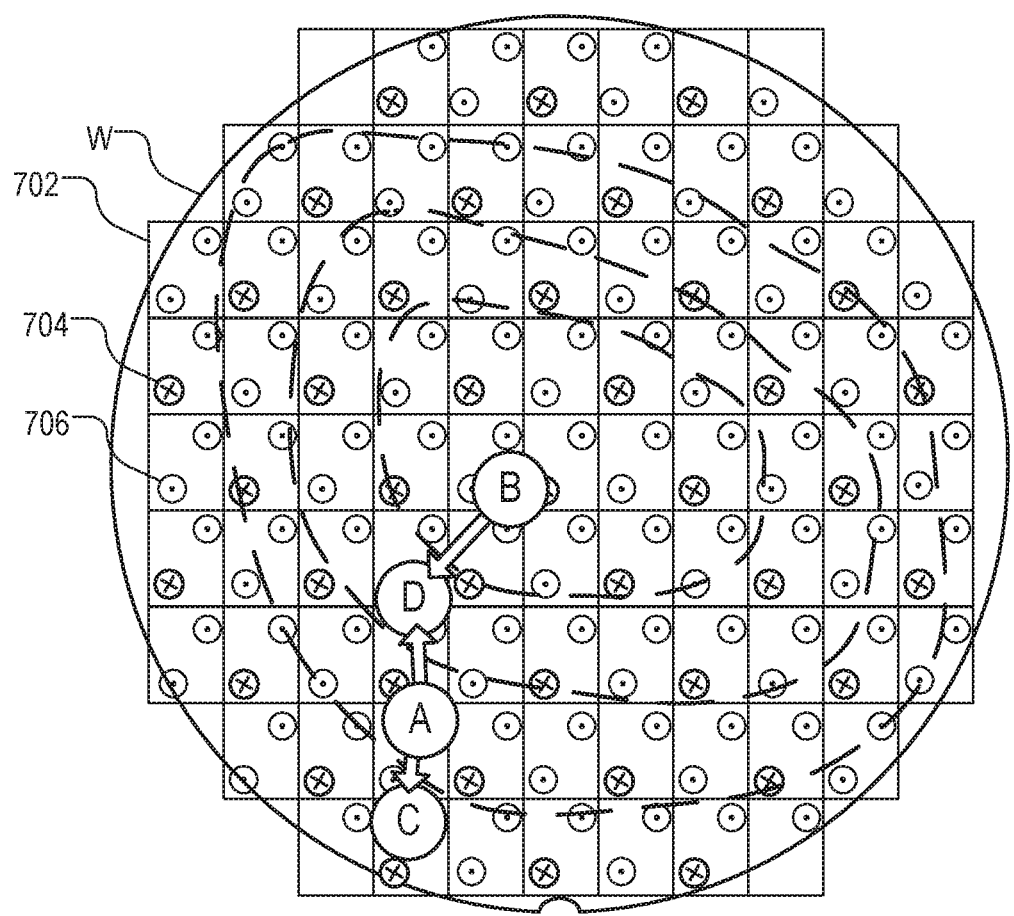
FIG. 7 illustrates the variation of optimum illumination conditions across an example substrate.

FIG. 7 illustrates embodiments in which a large number of target structures are measured across the fields 702 of a substrate W. In the example, each field 702 contains two metrology targets, which may be overlay gratings, focus gratings etc., the same as discussed in the prior art. In practice, each field may contain far more than two target structures. Furthermore, however many target structures are physically provided on the substrate, the measurement method may be designed to use only a subset of them. Such spatial subsampling will be designed so that the number of targets and their positions are enough to obtain the desired information, without undue measurement time. The spatial subsampling can be different from substrate to substrate, or the same on all substrates. The target structures to be measured, as well as the manner of measuring each one, can be defined in the metrology recipe mentioned above.

It will be noticed that, in FIG. 7, two different symbols are used for the metrology targets. A first subset of metrology targets 704, indicated by a circle with a cross, will be the ones to which the present method is applied, measuring each one using two or more variants of the illumination conditions. The remaining targets, among the ones to be measured, are labeled 706, and indicated by a circle with a dot. These ones can be measured with fewer variants, or only a single variant. Optionally, the variants used in these positions can be selected by reference to information obtained for measuring the neighboring targets of the first subset. To this end, it is a matter of design choice, whether all the targets of the first subset 704 are measured in advance of the intervening targets 706.

Regarding the first targets 704, and referring again to FIG. 5, one embodiment of the method seeks to identify, for each target structure, whether it falls in the case A, B, C or D. Contours have been drawn on FIG. 7, showing how, for example, image processor and controller PU can distinguish different regions of the substrate, by recognizing the case that applies, by comparing the signal strengths obtained for the three variants at each target 704. As mentioned already, the cases A and B can be unambiguously identified from the pattern of sample values. The cases C and D cannot be unambiguously identified, but they can be inferred by interpolation between the identified regions with cases A and B. In a real example, the number of regions may be far greater than the four regions shown in capital FIG. 7. Phase tracking algorithms can be applied to correctly assign all targets into one of the cases, and therefore to keep track of the optimum variant at all points over the substrate. A suitable phase tracking algorithm is discussed for application in another context, in the paper "Fast two-dimensional phase-unwrapping algorithm based on sorting by reliability following a noncontinuous path" by Miguel Arevallilo Herraez et al, APPLIED OPTICS, Vol. 41, No. 35 (December 2002), pp 7437-7444.

Application Example

Figure 8:
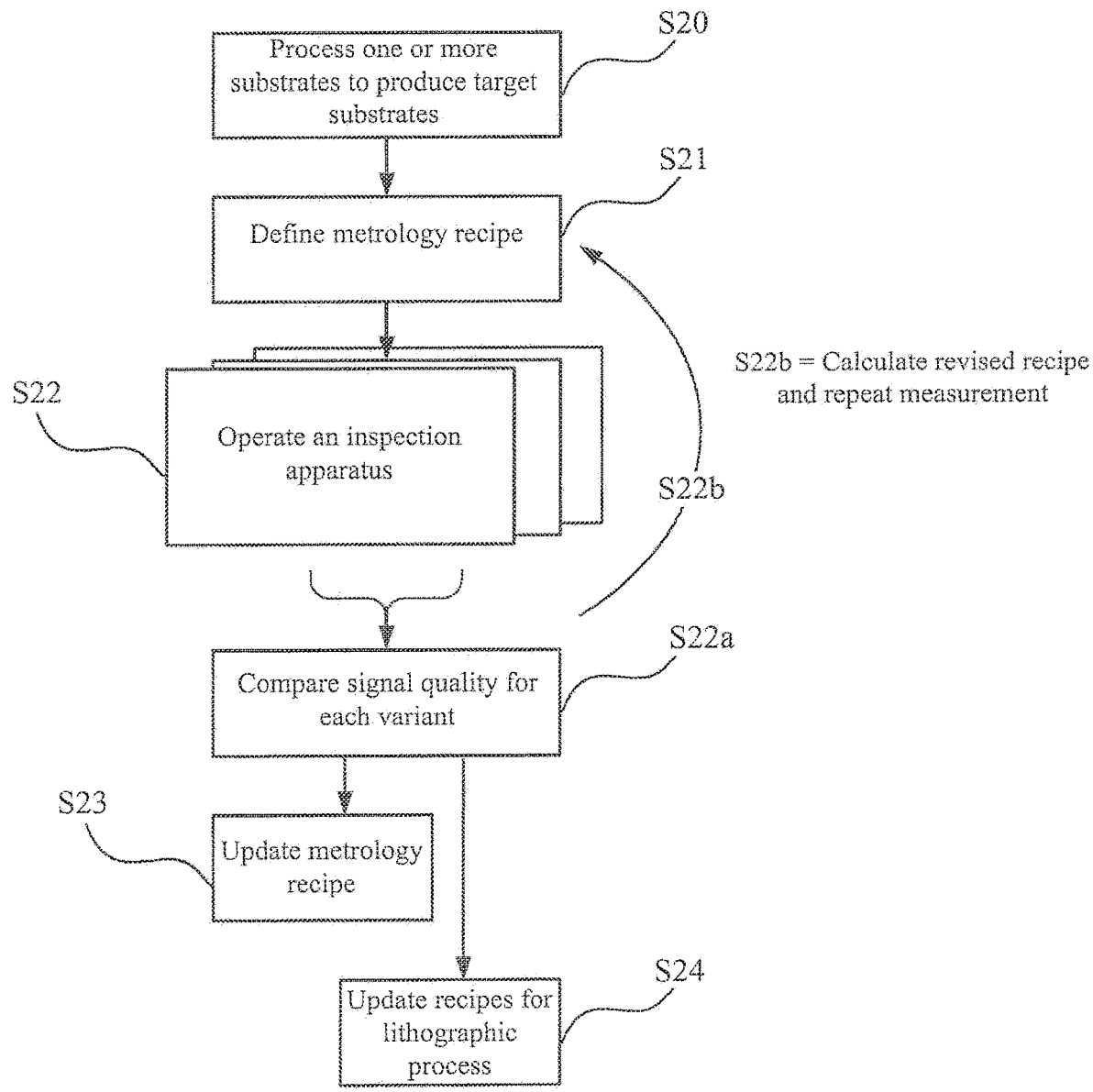
FIG. 8 is a flowchart of a method of controlling a lithographic process using the principles of FIGS. 3 to 7.

FIG. 8 illustrates a method of measuring performance of a lithographic process using the apparatus and methods outlined above. In step S20, one or more substrates are processed to produce target structures such as the composite grating targets described above. The design of target can be any of the known designs, or new designs. Targets may be large target or small target designs, depending whether the first measurement branch or second measurement branch of the apparatus is to be used. Targets may be designed for measurement of overlay, focus or dose through asymmetry. Targets may be designed for measurement of other performance parameters and/or non-asymmetry-related parameters. Linewidth or critical dimension CD is an example of a parameter that may be measured by scatterometry other than through measurement of asymmetry.

In step S21 metrology recipes are defined, including a recipe for measurement using multiple variance at each of at least a subset of the target structures on the substrate. In one embodiment, three wavelengths are selected as described above with reference to FIG. 6, so that at least one of the variants should be guaranteed to yield a reasonable signal strength. All the usual parameters of such a recipe are also defined, including the polarization, angular distribution and so forth. In other embodiments, or in addition to the variants having different wavelength spectra, variants having different angular distributions (illumination profiles) may be defined.

In step S22, the inspection apparatus of FIG. 2, for example, is operated to capture one or more diffraction spectra of a target structure using the specified illumination conditions for each variant. Properties such as asymmetry are calculated from the captured diffraction spectra of one or more targets. At step 22a the signal quality for each variant is compared, and a measurement is based on the optimum selection or combination of signals from the different variants.

By selecting and/or combining signals from the two or more variants, process dependency is reduced in the asymmetry measurements, leading to more accurate measurements of a performance parameter such as overlay, focus and/or dose.

At step S23, the metrology recipe may be updated in response to the obtained measurements and ancillary data. For example, the metrology techniques for a new product stack may be under development. In step S24, in a development and/or production phase of operating the lithographic production facility of FIG. 1, recipes for the lithographic process may be updated, for example to improve overlay in future substrates.

In addition to identifying and using a best selection or combination of variants to obtain the best measurement of a given target structure, the information about the closeness or otherwise of a variant to the optimal illumination conditions can be used to assign a reliability weighting to the obtained measurements of performance parameters such as overlay. Thus, for example, the measurements in the regions where case A or B applies in FIG. 7 may be associated with greater reliability than the measurements in regions where case C or D applies. Particularly when using phase tracking, the apparatus can identify for each measurement, how far it was from optimal conditions when that measurement was made. The advance process control systems that use metrology results to improve performance of the process in the longer term can make use of this "distance to optimum" as a reliability score, when incorporating the new measurements of overlay etc. into their process models.

In the above examples, it may be assumed that, based on past experimentation, an appropriate set of variants is defined for all the target structures. On the other hand, because of the use of these variants instead of a single value for each parameter of the illumination conditions, the measurement process can adapt to obtain the best signal quality and measurement accuracy, despite the presence of process variations across the substrate and/or between substrates. Using only two variants may be sufficient in some cases. However, as illustrated in FIGS. 5 and 7, the use of three appropriately spaced variants can yield additional information and more reliable results in some practical situations.

Optionally, at step 22b, it may be decided that none of the variants is close enough to the optimal illumination conditions, and a revised recipe is calculated and either the measurements are repeated, or the recipe is simply adjusted in advance of measuring further targets. The phase tracking method of FIG. 7 can be useful in this regard to identify which parts of the substrate should use the revised recipe. For the example of a cyclical variation, illustrated in FIGS. 5 and 6, this revision of the recipe need not be done so long as there is always another cycle with optimal conditions. In other situations, however, the dependency may not be cyclical, and the optimal illumination conditions may drift further from the current variants, as the process variations become stronger. The revised recipe, either for a whole substrate or with pre-programmed regions, can be used for subsequent substrates if desired, so that the system learns and updates the recipes, on the basis of experience.

The calculations to obtain measurements, and to control the selection of wavelengths and other recipe parameters, can be performed within the image processor and controller PU of the inspection apparatus. In alternative embodiments, the calculations of asymmetry and other parameters of interest can be performed remotely from the inspection apparatus hardware and controller PU. They may be performed for example in a processor within supervisory control system SCS, or in any computer apparatus that is arranged to receive the measurement data from the controller PU of the inspection apparatus. Control and processing of the calibration measurements can be performed in a processor separate from that which performs high-volume calculations using the correction values obtained. All of these options are a matter of choice for the implementer, and do not alter the principles applied or the benefits obtained.

Conclusion:

The principle disclosed above allows improved measurement accuracy to be obtained in structures having strong process dependency variations across the substrate or between substrates. The technique is suitable for application in asymmetry measurements to be made by dark field imaging methods, as well as other methods. Use of multiple variants of the illumination conditions provides enhanced accuracy, when the optimum illumination conditions vary across the substrate. Provided that the multiple variants can be implemented without undue delay of each measurement, the technique can be applied in high-volume manufacturing. This can be achieved by suitable design and implementation of the illumination system using modern laser sources, programmable aperture devices and so forth.

Additionally, the disclosed method and apparatus can deliver reliability scores with their measurements, so that process modeling systems can give higher weighting to measurements made at or close to the optimal conditions.

While specific embodiments of the invention have been described above, it will be appreciated that the invention may be practiced otherwise than as described.

While the inspection apparatus or tool illustrated in the embodiments comprises a particular form of scatterometer having first and second branches for simultaneous imaging of pupil plane and substrate plane by parallel image sensors, alternative arrangements are possible. Rather than provide two branches permanently coupled to objective lens 16 with beam splitter 17, the branches could be coupled selectively by a movable optical element such as a mirror. The optical system could be made having a single image sensor, the optical path to the sensor being reconfigured by movable elements to serve as a pupil plane image sensor and then a substrate plane image sensor.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

In association with the inspection apparatus hardware and suitable periodic structures realized on substrates and patterning devices, an embodiment may include a computer program containing one or more sequences of machine-readable instructions implementing methods of measurement of the type illustrated above to obtain information about a lithographic process. This computer program may be executed, for example, within image processor and controller PU in the apparatus of FIG. 2 and/or the control unit LACU of FIG. 1. There may also be provided a data storage medium (e.g., semiconductor memory, magnetic or optical disk) having such a computer program stored therein.

Further embodiments according to the present invention are described in below numbered clauses.

1. A method of measuring a property of a plurality of structures formed by a lithographic process on one or more substrates, wherein a measurement of said property of each structure is derived at least partly from radiation collected after being scattered by the structure under a given set of illumination conditions, wherein, for a given set of illumination conditions, accuracy of said measurement for different ones of said structures is influenced by process variations across the substrate and/or between substrates, and wherein the method is performed using radiation collected under two or more variants of said illumination conditions, and for different ones of said structures the measurement of said property is derived using radiation collected under a different selection or combination of said variants.

2. A method according to clause 1 wherein for at least a subset of the structures radiation is collected from each structure using a common set of variants of said illumination conditions, and the selection or combination of variants used in deriving the measurement is performed after collecting the radiation.

3. A method according to clause 2 wherein the selection or combination of variants for said subset of the structures is based at least partly on a signal quality observed in the radiation collected from the structure under different variants of said illumination conditions.

4. A method according to clause 2 or 3 wherein the selection or combination of variants for said subset of structures is based at least partly on a signal quality observed in the radiation collected from one or more neighboring structures under different variants of said illumination conditions.

5. A method according to clause 3 or 4 wherein a selection or combination of variants for measurement of structures outside said subset is based on the signal quality observed in the radiation collected from the structures within said subset.

6. A method according to any preceding clause wherein said radiation is narrowband radiation and said two or more variants include at least two different spectral peaks of radiation which are substantially non-overlapping.

7. A method according to clause 6 wherein said two or more spectral peaks are spaced over a wavelength range of less than 30 nm.

8. A method according to clause 6 or 7 wherein said narrowband radiation in each variant has a bandwidth less than 10 nm.

9. A method according to any of clauses 6 to 8 wherein said signal quality exhibits a cyclical variation as a function of wavelength, and wherein said two or more spectral peaks are separated by approximately a half of one cycle of said cyclical variation or less.

10. A method according to any preceding clause wherein said radiation has a non-uniform angular distribution and where said angular distribution varies between said two or more variants.

11. A method according to clause 10 wherein said radiation has a non-uniform angular distribution defined by bright and dark portions in an illumination pupil plane, and wherein one or more boundaries between bright and dark portions are shifted between said two or more variants.

12. A method according to any preceding clause wherein a focus setting varies between two or more of said variants.

13. A method according to any preceding clause wherein for at least one characteristic of said illumination conditions said selection or combination of variants comprises selecting a single best variant for use in deriving said measurement.

14. A method according to any preceding clause wherein for at least one characteristic of said illumination conditions said selection or combination of variants comprises a weighted combination of variants for use in deriving said measurement.

15. A method according to any preceding clause wherein at least one characteristic of said illumination conditions is represented by a variable parameter, said two or more variants being defined by variant values of said parameter.

16. A method according to any of clauses further comprising calculating a performance parameter of said lithographic process based on the measurements of said property for one or more of said structures.

17. A method according to clause 16 further comprising calculating a reliability score for the performance parameter, based on comparison of the signal quality for the different variants when measuring the same structure and/or neighboring structures.

18. An inspection apparatus for measuring a property of a plurality of structures formed by a lithographic process on one or more substrates, the apparatus comprising an illumination optical system, an collection optical system and a processing system, the processing system being arranged to derive a measurement of said property of each structure at least partly from radiation collected by said collection optical system after being scattered by the structure under one or more sets of illumination conditions established by the illumination optical system, wherein, for a given set of illumination conditions, accuracy of said measurement for different ones of said structures is influenced by process variations across the substrate and/or between substrates, wherein the illumination system and collection system are arranged to collect radiation scattered by a plurality of structures under two or more variants of said illumination conditions, and wherein said processing system is arranged to derive the measurement of said property using radiation collected under a different selection or combination of said variants for different ones of said structures.

19. An apparatus according to clause 18 wherein for at least a subset of the structures radiation is collected from each structure using a common set of variants of said illumination conditions, and the selection or combination of variants used in deriving the measurement is performed after collecting the radiation.

20. An apparatus according to clause 19 wherein the selection or combination of variants for said subset of the structures is based at least partly on a signal quality observed in the radiation collected from the structure under different variants of said illumination conditions.

21. An apparatus according to clause 19 or 20 wherein the selection or combination of variants for said subset of structures is based at least partly on a signal quality observed in the radiation collected from one or more neighboring structures under different variants of said illumination conditions.

22. An apparatus according to clause 20 or 21 wherein a selection or combination of variants for measurement of structures outside said subset is based on the signal quality observed in the radiation collected from the structures within said subset.

23. An apparatus according to any of clauses 18 to 22 wherein the illumination system is arranged to provide said radiation as narrowband radiation and said two or more variants include at least two different spectral peaks of radiation which are substantially non-overlapping.

24. An apparatus according to clause 23 wherein said two or more spectral peaks are spaced over a wavelength range of less than 30 nm.

25. An apparatus according to clause 23 or 24 wherein said narrowband radiation in each variant has a bandwidth less than 10 nm.

26. An apparatus according to any of clauses 23 to 25 wherein said signal quality exhibits a cyclical variation as a function of wavelength, and wherein said two or more spectral peaks are separated by approximately a half of one cycle of said cyclical variation or less.

27. An apparatus according to any of clauses 18 to 26 wherein the illumination system is arranged to provide said radiation with a non-uniform angular distribution and where said angular distribution varies between said two or more variants.

28. An apparatus according to clause 27 wherein said radiation has a non-uniform angular distribution defined by bright and dark portions in an illumination pupil plane, and wherein one or more boundaries between bright and dark portions are shifted between said two or more variants.

29. An apparatus according to any of clauses 18 to 28 wherein a focus setting varies between two or more of said variants.

30. An apparatus according to any of clauses 18 to 29 wherein for at least one characteristic of said illumination conditions said selection or combination of variants comprises selecting a single best variant for use in deriving said measurement.

31. An apparatus according to any of clauses 18 to 30 wherein for at least one characteristic of said illumination conditions said selection or combination of variants comprises a weighted combination of variants for use in deriving said measurement.

32. An apparatus according to any of clauses 18 to 31 wherein at least one characteristic of said illumination conditions is represented by a variable parameter, said two or more variants being defined by variant values of said parameter.

33. An apparatus according to any of clauses 18 to 32 wherein said processing system is further arranged to calculate a performance parameter of said lithographic process based on the measurements of said property for one or more of said structures.

34. An apparatus according to clause 33 further comprising calculating a reliability score for the performance parameter, based on comparison of the signal quality for the different variants when measuring the same structure and/or neighboring structures.

35. An apparatus according to any of clauses 18 to 34 wherein said processing system includes a controller for controlling said illumination optical system and collection system automatically to collect said radiation scattered under the different variants of illumination conditions.

36. A computer program product comprising machine readable instructions for causing a programmable processing device to derive a measurement of a property of a plurality of structures in the method of any of clauses 1 to 17.

37. A computer program product according to clause 36 wherein said machine readable instructions are further arranged to cause the programmable processing device to control automatically the illumination conditions of the structures and to control the collection of said scattered radiation under said variants of said illumination conditions.

38. A lithographic system comprising:
a lithographic apparatus comprising:
an illumination optical system arranged to illuminate a pattern;
a projection optical system arranged to project an image of the pattern onto a substrate; and
an inspection apparatus according to any of clauses 18 to 34,
wherein the lithographic apparatus is arranged to use the measurement results from the inspection apparatus, in applying the pattern to further substrates.

39. A method of manufacturing devices wherein a device pattern is applied to a series of substrates using a lithographic process, the method including measuring one or more properties of at one or more structures formed as part of or beside said device pattern on at least one of said substrates using a method according to any of clauses 1 to 17, and controlling the lithographic process for later substrates in accordance with the result of the measuring.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for measuring a property of a plurality of structures formed by a lithographic process on one or more substrates, the method comprising:
capturing one or more diffraction spectra from a structure of the plurality of structures for two or more variants of an illumination parameter;
determining a signal quality for each of the two or more variants of the illumination parameter based on the captured one or more diffraction spectra; and
determining, based on the determined signal qualities, one of the two or more variants of the illumination parameter or a combination of two or more of the two or more variants of the illumination parameter for the measuring of the property of the structure.

2. The method of claim 1, wherein:
for at least a subset of the plurality of structures, the two or more variants of the illumination parameter are part of a common set of variants of the illumination parameter,
the determining the one of the two or more variants of the illumination parameter or the combination of two or more of the two or more variants of the illumination parameter is performed after the capturing one or more diffraction spectra.

3. The method of claim 1, wherein:
for at least a subset of the plurality of structures, the two or more variants of the illumination parameter are part of a common set of variants of the illumination parameter,
the determining the one of the two or more variants of the illumination parameter or the combination of two or more of the two or more variants of the illumination parameter is performed after the capturing one or more diffraction spectra, and
the determining the one of the two or more variants of the illumination parameter or the combination of two or more of the two or more variants of the illumination parameter for the subset of the plurality of structures is based at least in part on the signal qualities associated with one or more neighboring structures in the subset of the plurality of structures under the two more variants of the illumination parameter.

4. The method of claim 3, further comprising:
determining a second one of the two or more variants of the illumination parameter or a second combination of two or more of the two or more variants of the illumination parameter for measuring a second parameter of one or more structures outside the subset of the plurality of structures based on the signal qualities associated with the subset of the plurality of structures.

5. The method of claim 1, wherein:
the two or more variants of the illumination parameter comprise at least two different spectral peaks of an illumination radiation, which are substantially non-overlapping,
the two or more spectral peaks are spaced over a wavelength range of less than 30 nm, and
the illumination radiation is a narrowband radiation.

6. The method of claim 5, wherein the narrowband radiation in each variant has a bandwidth less than 10 nm.

7. The method of claim 1, wherein:
the two or more variants of the illumination parameter comprise at least two different spectral peaks of an illumination radiation, which are substantially non-overlapping,
at least one of the determined signal qualities comprises a cyclical variation as a function of wavelength,
the two or more spectral peaks are separated by approximately a half of one cycle of the cyclical variation or less, and
the illumination radiation is a narrowband radiation.

8. The method of claim 1, wherein:
the illumination parameter comprises a non-uniform angular distribution that varies between the two or more variants,
the non-uniform angular distribution is defined by bright and dark portions in an illumination pupil plane, and
one or more boundaries between the bright and dark portions are shifted between the two or more variants.

9. The method of claim 1, further comprising:
calculating a performance parameter of the lithographic process based on the measuring the property of the structure; and
calculating a reliability score for the performance parameter, based on comparison of the determined signal qualities for the two or more variants of the illumination parameter.

10. An inspection apparatus for measuring a property of a plurality of structures formed by a lithographic process on one or more substrates, the apparatus comprising:
an illumination optical system,
a collection optical system configured to capture one or more diffraction spectra from a structure of the plurality of structures for two or more variants of an illumination parameter; and
a processing system configured to:
determine a signal quality for each of the two or more variants of the illumination parameter based on the captured one or more diffraction spectra; and
determine, based on the determined signal qualities, one of the two or more variants of the illumination parameter or a combination of two or more of the two or more variants of the illumination parameter for the measuring the property of the structure.

11. The inspection apparatus of claim 10, wherein:
for at least a subset of the plurality of structures, the two or more variants of the illumination parameter are part of a common set of variants of the illumination parameter,
the determining the one of the two or more variants of the illumination parameter or the combination of two or more of the two or more variants of the illumination parameter is performed after the capturing one or more diffraction spectra.

12. The inspection apparatus of claim 10, wherein:
for at least a subset of the plurality of structures, the two or more variants of the illumination parameter are part of a common set of variants of the illumination parameter,
the determining the one of the two or more variants of the illumination parameter or the combination of two or more of the two or more variants of the illumination parameter is performed after the capturing one or more diffraction spectra, and
the determining the one of the two or more variants of the illumination parameter or the combination of two or more of the two or more variants of the illumination parameter for the subset of the plurality of structures is based at least in part on signal qualities associated with one or more neighboring structures in the subset of the plurality of structures under the two or more variants of the illumination parameter.

13. The inspection apparatus of claim 12, wherein the processing system is further configured to determine a second one of the two or more variants of the illumination parameter or a second combination of two or more variants of the illumination parameter for measuring a second parameter of one or more structures outside the subset of the plurality of structures based on the signal qualities associated with the subset of the plurality of structures.

14. The inspection apparatus of claim 10, wherein:
the illumination optical system is configured to provide an illumination radiation as a narrowband radiation,
the two or more variants of the illumination parameter comprise at least two different spectral peaks of the illumination radiation, which are substantially non-overlapping, and
two or more spectral peaks are spaced over a wavelength range of less than 30 nm.

15. The inspection apparatus of claim 14, wherein the narrowband radiation in each variant has a bandwidth less than 10 nm.

16. The inspection apparatus of claim 10, wherein:
the illumination optical system is configured to provide an illumination radiation as a narrowband radiation, the two or more variants of the illumination parameter comprise at least two different spectral peaks of the illumination radiation, which are substantially non-overlapping, at least one of the determined signal qualities comprises a cyclical variation as a function of wavelength, and the two or more spectral peaks are separated by approximately a half of one cycle of the cyclical variation or less.

17. The inspection apparatus of claim 10, wherein:

the illumination optical system is configured to provide an illumination radiation with a non-uniform angular distribution, the non-uniform angular distribution varies between the two or more variants, the non-uniform angular distribution is defined by bright and dark portions in an illumination pupil plane, and one or more boundaries between the bright and dark portions are shifted between the two or more variants.

18. The inspection apparatus of claim 10, wherein the processing system is further configured to calculate a performance parameter of the lithographic process based on the measurements of the property of the structure.

19. The inspection apparatus of claim 18, wherein the processing system is further configured to calculate a reliability score for the performance parameter based on comparison of the determined signal qualities for the two or more variants of the illumination parameter.

20. The inspection apparatus of claim 10, wherein the processing system comprises a controller configured to control the illumination optical system and the collection optical system automatically to collect the one or more diffraction spectra and the two or more variants of the illumination parameter.

21. A system comprising:

an illumination optical system;

a collection optical system configured to cause capture of one or more diffraction spectra from a structure of a plurality of structures for two or more variants of an illumination parameter; and a non-transitory computer program product comprising machine readable instructions for causing a programmable processing device to perform operations comprising:

determining a signal quality for each of the two or more variants of the illumination parameter based on the captured one or more diffraction spectra; and determining, based on the determined signal qualities, one of the two or more variants of the illumination parameter or a combination of two or more variants of the illumination parameter for measuring a property of the structure of the plurality of structures.

22. The system of claim 21, wherein the machine readable instructions of the non-transitory computer program product are further configured to cause the programmable processing device to control automatically the illumination parameter and to control the capture of the one or more diffraction spectra from the structure under the two or more variants of the illumination parameter.

* * * * *